US012593557B2

(12) United States Patent
Zhang et al.

(10) Patent No.: US 12,593,557 B2
(45) Date of Patent: Mar. 31, 2026

(54) DISPLAY SUBSTRATE AND DISPLAY APPARATUS

(71) Applicant: BOE Technology Group Co., Ltd., Beijing (CN)

(72) Inventors: Xing Zhang, Beijing (CN); Yicheng Lin, Beijing (CN); Pan Xu, Beijing (CN); Ying Han, Beijing (CN); Guoying Wang, Beijing (CN); Zhan Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 573 days.

(21) Appl. No.: 17/921,077

(22) PCT Filed: May 8, 2021

(86) PCT No.: PCT/CN2021/092354
§ 371 (c)(1),
(2) Date: Oct. 24, 2022

(87) PCT Pub. No.: WO2021/238619
PCT Pub. Date: Dec. 2, 2021

(65) Prior Publication Data
US 2023/0343812 A1      Oct. 26, 2023

(30) Foreign Application Priority Data
May 25, 2020      (CN) ......................... 202010447212.X

(51) Int. Cl.
*H10H 29/14*          (2025.01)
*H10K 59/121*       (2023.01)
(Continued)

(52) U.S. Cl.
CPC ......... *H10H 29/142* (2025.01); *H10K 59/121* (2023.02); *H10K 59/353* (2023.02);
(Continued)

(58) Field of Classification Search
CPC .. H10H 29/142; H10K 59/353; H10K 59/351; H10K 59/121; H10K 2102/3031; G09G 2300/0452
See application file for complete search history.

(56) References Cited

U.S. PATENT DOCUMENTS 10,439,009 B2 * 10/2019 Bok ....................... H10K 59/40
2014/0307430 A1    10/2014 Lo et al.
(Continued)

FOREIGN PATENT DOCUMENTS

| CN | 103440822 A | 12/2013 |
| CN | 107479242 A | 12/2017 |

(Continued)

OTHER PUBLICATIONS

Translation of KR_20210137340_A (Year: 2021).*
PCT/CN2021/092354 international search report.

*Primary Examiner* — Aaron J Gray
(74) *Attorney, Agent, or Firm* — IPro, PLLC

(57)      ABSTRACT

A display substrate and a display apparatus. Each pixel repeat unit (10) includes two pixel regions (P1, P2) arranged in a first direction, and a light transmission region (T) located between the two pixel regions (P1, P2), where each of the pixel regions (P1, P2) is provided with at least three sub-pixels (A, B, C) which are adjacently provided; and the area of the light transmission region (T) is equal to twice the area of a light transmission region (T) corresponding to a single pixel region (P1, P2).

17 Claims, 18 Drawing Sheets

(51) Int. Cl.
   H10K 59/35 (2023.01)
   H10K 102/00 (2023.01)

(52) U.S. Cl.
   CPC ... *G09G 2300/0452* (2013.01); *H10K 59/351*
   (2023.02); *H10K 2102/3031* (2023.02)

(56)                  References Cited

U.S. PATENT DOCUMENTS

| | | | |
|---|---|---|---|
| 2019/0025635 A1 | 1/2019 | Chen | |
| 2019/0043842 A1* | 2/2019 | Guo | G09G 3/3233 |
| 2019/0131365 A1 | 5/2019 | Jung | |
| 2019/0206953 A1* | 7/2019 | Hsieh | H10K 59/65 |
| 2021/0066259 A1 | 3/2021 | Wang et al. | |
| 2021/0351241 A1* | 11/2021 | Cho | H10K 59/121 |

FOREIGN PATENT DOCUMENTS

| | | | | |
|---|---|---|---|---|
| CN | 109728182 A | 5/2019 | | |
| CN | 110517595 A | 11/2019 | | |
| CN | 110703487 A | 1/2020 | | |
| CN | 111477113 A | 7/2020 | | |
| KR | 20150102249 A | 9/2015 | | |
| KR | 20210137340 A * | 11/2021 | | G06F 1/1624 |
| WO | WO-2019015605 A1 * | 1/2019 | | G09G 3/3225 |

* cited by examiner

Fig. 1A

DISPLAY SUBSTRATE AND DISPLAY APPARATUS

CROSS REFERENCE TO RELATED APPLICATIONS

The present disclosure is a US National Stage of International Application No. PCT/CN2021/092354, filed on May 8, 2021, which claims priority to the Chinese Patent Application No. 202010447212.X, filed to the China Patent Office on May 25, 2020 and entitled "DISPLAY SUBSTRATE AND DISPLAY APPARATUS", the entire contents of which are incorporated herein by reference.

FIELD

The present disclosure relates to the technical field of display, in particular to a display substrate and a display apparatus.

BACKGROUND

High pixels per inch (PPI) transparent display, whether flexible display or rigid display, can produce good visual experience in all fields. High PPI transparent display products on the market today are basically small-sized screens. Large-size transparent products also mostly have low PPI. Although the high PPI large-size transparent display is in high market demand, there are still difficulties to overcome for the technology.

SUMMARY

A display substrate provided by an embodiment of the present disclosure includes a plurality of pixel repeat groups arranged sequentially in a first direction, and each of the pixel repeat groups includes a plurality of pixel repeat units arranged in a second direction;

each of the pixel repeat units includes two pixel regions arranged in the first direction and a light transmission region located between the two pixel regions;

at least three sub-pixels are adjacently arranged in each of the pixel regions; and an area of the light transmission region is equal to twice an area of a light transmission region corresponding to one of the pixel regions, where the area of the light transmission region corresponding to the one of the pixel regions is equal to a total area of all light transmission regions in the display substrate divided by the quantity of all pixel regions in the display substrate.

Optionally, in the display substrate provided by the embodiment of the present disclosure, sub-pixels belonging to adjacent pixel regions in two adjacent pixel repeat groups respectively are connected to each other.

Optionally, in the display substrate provided by the embodiment of the present disclosure, in each of the pixel repeat units, border lines of the pixel regions and the light transmission region are folded lines.

Optionally, in the display substrate provided by the embodiment of the present disclosure, each of the pixel regions includes a first sub-pixel, a second sub-pixel and a third sub-pixel, and lines connecting centers of the first sub-pixel, the second sub-pixel and the third sub-pixel form a triangle.

Optionally, in the display substrate provided by the embodiment of the present disclosure, in each of the pixel regions, the first sub-pixel and the second sub-pixel are adjacently arranged in the first direction, the third sub-pixel and the first sub-pixel are adjacently arranged in the second direction, and the second sub-pixel and the third sub-pixel are both arranged adjacent to the light transmission region in the first direction.

Optionally, in the display substrate provided by the embodiment of the present disclosure, in one pixel region of each of the pixel repeat units, the first sub-pixel and the second sub-pixel are adjacently arranged in the first direction, the third sub-pixel and the first sub-pixel are adjacently arranged in the second direction, and the second sub-pixel and the third sub-pixel are both arranged adjacent to the light transmission region in the first direction; and in the other pixel region of each of the pixel repeat units, the first sub-pixel and the second sub-pixel are adjacently arranged in the first direction, the third sub-pixel and the second sub-pixel are adjacently arranged in the second direction, and the first sub-pixel and the third sub-pixel are both arranged adjacent to the light transmission region in the first direction.

Optionally, in the display substrate provided by the embodiment of the present disclosure, in each of the pixel repeat units, the third sub-pixel in one pixel region and the first sub-pixel and the second sub-pixel in the other pixel region are arranged in the first direction.

Optionally, in the display substrate provided by the embodiment of the present disclosure, the third sub-pixel and the first sub-pixel are adjacently arranged in the second direction, the second sub-pixel is respectively arranged adjacent to the first sub-pixel and the third sub-pixel in the first direction, and the first sub-pixel, the second sub-pixel and the third sub-pixel are all arranged adjacent to the light transmission region in the first direction.

Optionally, in the display substrate provided by the embodiment of the present disclosure, in one pixel region of each of the pixel repeat units, the third sub-pixel and the first sub-pixel are adjacently arranged in the second direction, the second sub-pixel is respectively arranged adjacent to the first sub-pixel and the third sub-pixel in the first direction, and the first sub-pixel, the second sub-pixel and the third sub-pixel are all arranged adjacent to the light transmission region in the first direction; and in the other pixel region of each of the pixel repeat units, the third sub-pixel and the second sub-pixel are adjacently arranged in the second direction, the first sub-pixel is respectively arranged adjacent to the second sub-pixel and the third sub-pixel in the first direction, and the first sub-pixel, the second sub-pixel and the third sub-pixel are all arranged adjacent to the light transmission region in the first direction.

Optionally, in the display substrate provided by the embodiment of the present disclosure, each of the pixel regions includes a first sub-pixel, a second sub-pixel, a third sub-pixel and a fourth sub-pixel; and lines connecting centers of the first sub-pixel, the second sub-pixel, the third sub-pixel and the fourth sub-pixel form a parallelogram.

Optionally, in the display substrate provided by the embodiment of the present disclosure, in each of the pixel regions, the first sub-pixel and the second sub-pixel are adjacently arranged in the first direction, and the third sub-pixel and the fourth sub-pixel are adjacently arranged in the first direction;

one of the first sub-pixel and the second sub-pixel is arranged adjacent to one of the third sub-pixel and the fourth sub-pixel in the second direction; and the other of the first sub-pixel and the second sub-pixel and the other of the third sub-pixel and the fourth sub-pixel are arranged in a staggered mode.

Optionally, in the display substrate provided by the embodiment of the present disclosure, in each of the pixel repeat units, the third sub-pixel and the fourth sub-pixel in one pixel region and the first sub-pixel and the second sub-pixel in the other pixel region are arranged in the first direction.

Optionally, in the display substrate provided by the embodiment of the present disclosure, two of the first sub-pixel, the second sub-pixel, the third sub-pixel and the fourth sub-pixel are sub-pixels with the same light emitting color.

Correspondingly, an embodiment of the present disclosure further provides a display apparatus, including the above display substrate provided by the embodiments of the present disclosure.

BRIEF DESCRIPTION OF THE DRAWINGS

Figure 1A:
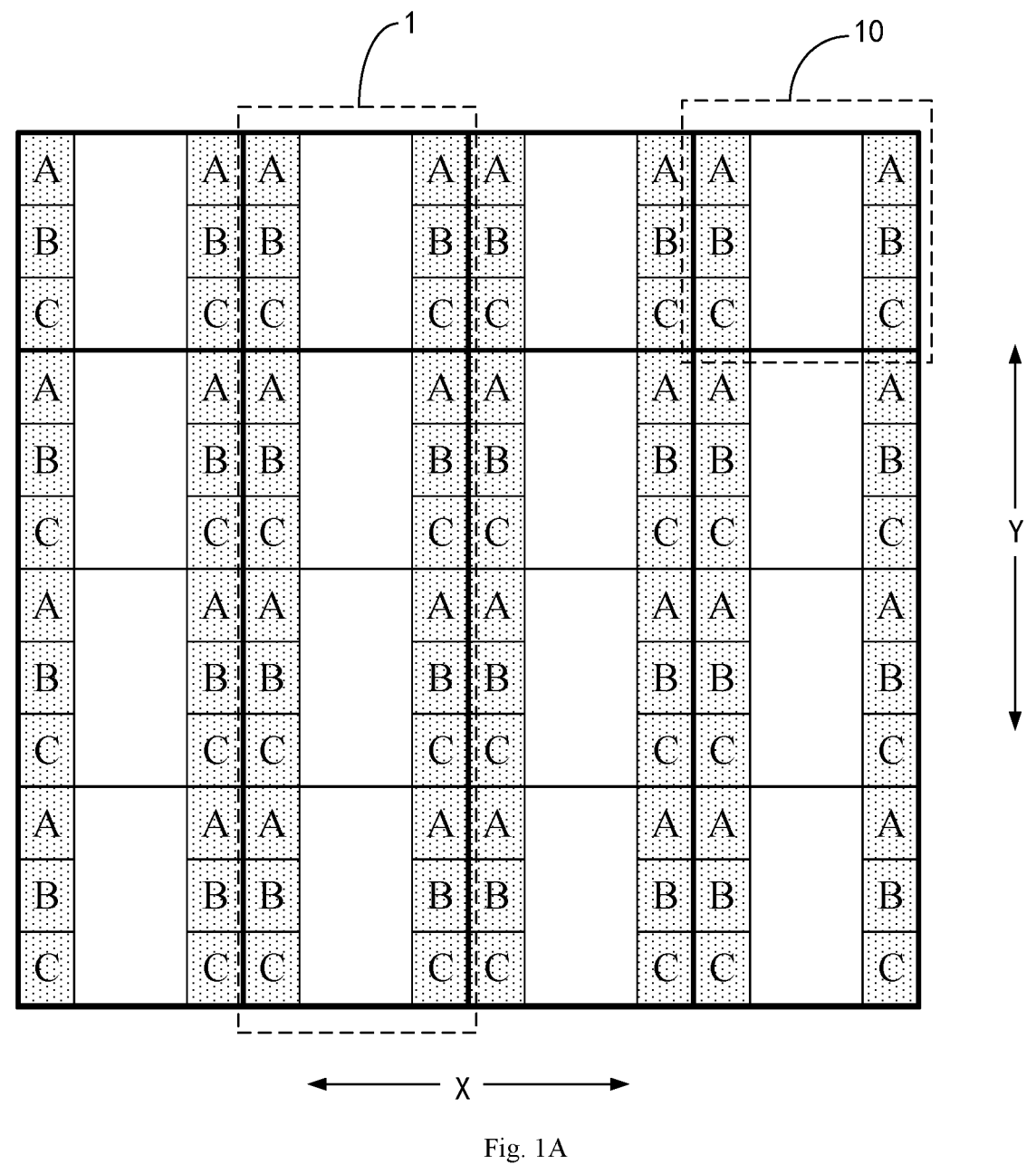

FIG. 1A is a partial schematic structural diagram of a display substrate provided by an embodiment of the present disclosure.

DETAILED DESCRIPTION OF THE EMBODIMENTS

Figure 1B:
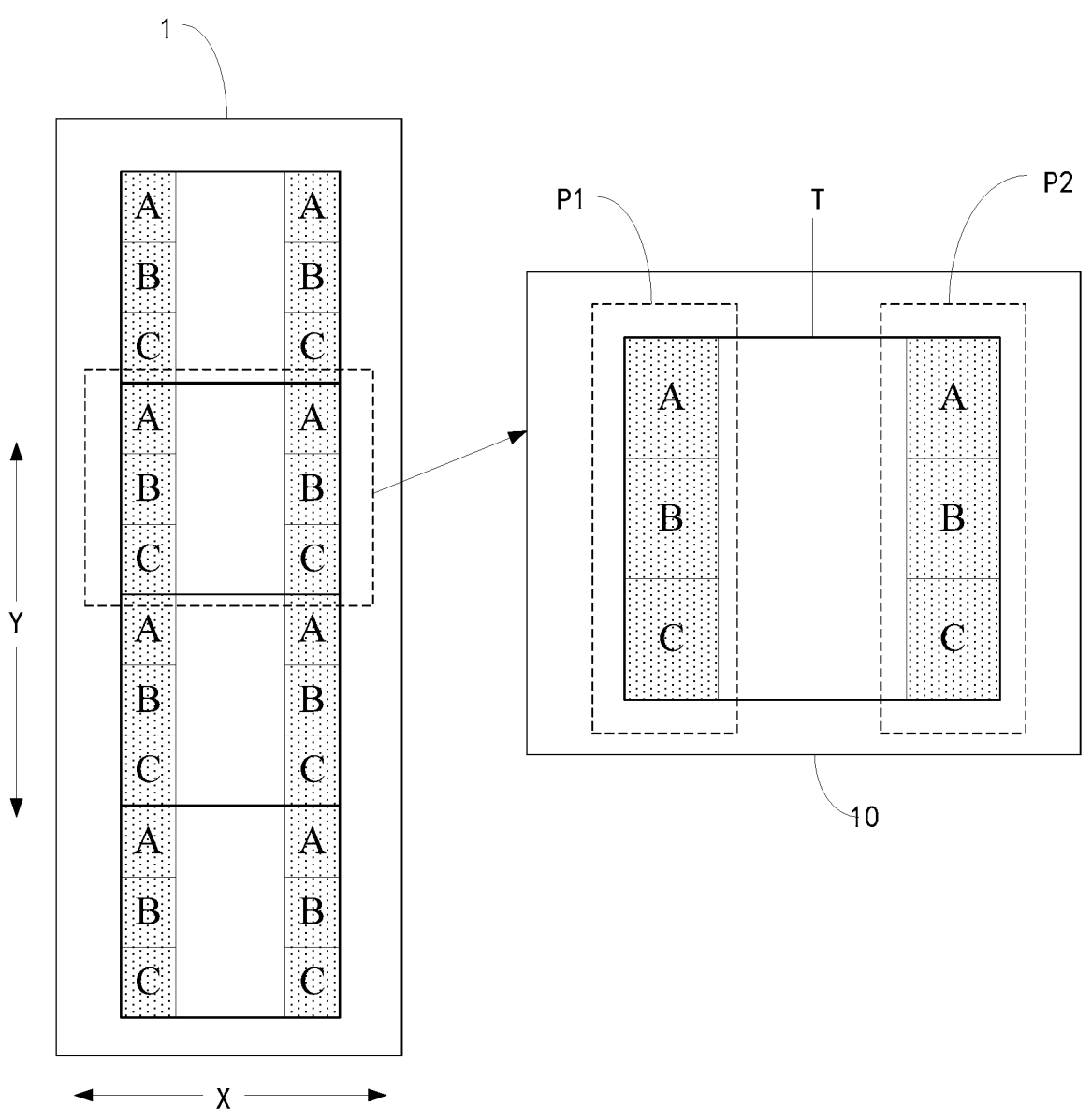
FIG. 1B is a schematic structural diagram of a pixel repeat unit group in the display substrate shown in FIG. 1A.

A bottleneck of large-size high PPI transparent display is that as the PPI increases, the pixel size becomes smaller, the density of metal traces increases, and the area of a transparent region decreases, which makes it easier for the small-aperture diffraction effect to occur while affecting the transmittance; and it is reflected in the actual experience that objects seen through a display substrate have a ghosting phenomenon, which seriously affects the customer experience.

Therefore, how to reduce the diffraction ghosting phenomenon of a large-size high PPI display substrate is an urgent technical problem to be solved.

In order to make the objectives, features and advantages of the present disclosure more apparent and understandable, the present disclosure will be further described below with reference to the accompanying drawings and embodiments. However, example implementations can be implemented in a variety of forms and should not be construed as limitations to the implementations set forth herein; and on the contrary, providing these implementations makes the present disclosure more comprehensive and complete, and comprehensively communicates the concept of the example implementations to those skilled in the art. In the figures, the same reference numerals represent the same or similar structures, so their repeated description will be omitted. The words expressing positions and directions described in the present disclosure are illustrated by taking the accompanying drawings as an example, but they can also be changed as needed, and all the changes are included in the protection scope of the present disclosure. The accompanying drawings of the present disclosure are merely used to illustrate a relative positional relationship and do not represent the true scale.

It should be noted that specific details are described in the following description in order to facilitate full understanding of the present disclosure. However, the present disclosure can be implemented in a variety of other ways different from those described herein, and those skilled in the art may make similar extensions without contradicting the context of the present disclosure. The present disclosure is therefore not limited by the specific implementations disclosed below. The following description of the specification is a preferred implementation of the present disclosure, but the description is intended to illustrate the general principles of the present disclosure and is not intended to limit the scope of the present disclosure. The protection scope of the present disclosure shall be as defined in the appended claims.

A display substrate and a display apparatus provided by the embodiments of the present disclosure are specifically described below in conjunction with the accompanying drawings.

A display substrate provided by an embodiment of the present disclosure is as shown in FIG. 1A and FIG. 1B, where, FIG. 1B is a schematic structural diagram of a pixel repeat unit group in the display substrate shown in FIG. 1A; the display substrate includes a plurality of pixel repeat groups 1 arranged sequentially in a first direction X, and each of the plurality of pixel repeat groups 1 includes a plurality of pixel repeat units 10 arranged in a second direction Y; each of the plurality of pixel repeat units 10 includes two pixel regions P1 and P2 arranged in the first direction X and a light transmission region T located between the two pixel regions P1 and P2; where, at least three sub-pixels (A, B and C in FIG. 1A and FIG. 1B) are adjacently arranged in each of the pixel regions P1 and P2; and an area of the light transmission region T is equal to twice an area of a light transmission region corresponding to a single pixel region P1 or P2, where, the area of the light transmission region corresponding to the single pixel region P1 or P2 is equal to a total area of all light transmission regions in the display substrate divided by the number of all pixel regions in the display substrate.

In the display substrate provided by the embodiments of the present disclosure, each of the pixel repeat units includes the two pixel regions arranged in the first direction, and the light transmission region located between the two pixel regions; where, at least three sub-pixels are adjacently arranged in each of the pixel regions; and the area of the light transmission region is equal to twice the area of the light transmission region corresponding to the single pixel region. It is regarded as the situation where light transmission regions which respectively correspond to two pixel regions in the related art are spliced together and the spliced light transmission region is placed between the two pixel regions. On the basis that the total area of the light transmission region in the display substrate is not increased, the area of each independent light transmission region in a display panel is increased to twice the area of a single light transmission region in an existing display substrate, thereby reducing the diffraction phenomenon of the display substrate, and improving the problem of ghosting.

It should be noted that in the display substrate provided by the embodiments of the present disclosure, one pixel region is correspondingly provided with one pixel, so the number of the pixel regions in the display substrate is the number of the pixels in the display substrate.

During specific implementation, in the embodiments of the present disclosure, the first direction and the second direction are crossed. The first direction may be a row direction and the second direction may be a column direction, or the first direction may be the column direction and the second direction may be the row direction, which is not limited herein. The accompanying drawings of the specification of the present disclosure are illustrated with the first direction as the row direction and the second direction as the column direction.

Optionally, in the display substrate provided by the embodiments of the present disclosure, as shown in FIG. 2A-FIG. 2B, FIG. 3A-FIG. 3B, FIG. 4A-FIG. 4B, FIG. 5A-FIG. 5B, FIG. 6A-FIG. 6B, FIG. 7A-FIG. 7B, FIG. 8A-FIG. 8B, and FIG. 9A-FIG. 9B, in each of the pixel repeat units 10, border lines of the pixel regions P1 and P2 and the light transmission region T are folded lines, such that in each of the pixel repeat groups 1, a border line of an independent light transmission region spliced together by the light transmission regions T in the pixel repeat unit 10 is a folded line, thereby changing a light path of small-aperture diffraction to a certain extent and further weakening the small-aperture diffraction phenomenon.

During specific implementation, in the display substrate provided by the embodiment of the present disclosure, for any two pixel repeat groups adjacent in the first direction, border shapes of the adjacent pixel regions belonging to the two pixel repeat groups respectively are matched, so as to ensure that the sub-pixels in the adjacent pixel repeat groups can be closely arranged, and it can also be considered that the sub-pixels belonging to the adjacent pixel regions in the two adjacent pixel repeat groups respectively are connected to each other.

Optionally, in the display substrate provided by the embodiments of the present disclosure, as shown in FIG. 2A-FIG. 2B, FIG. 3A-FIG. 3B, FIG. 4A-FIG. 4B, and FIG. 5A-FIG. 5B, in each of the pixel repeat units 10, each of the pixel regions P1 and P2 includes a first sub-pixel A, a second sub-pixel B and a third sub-pixel C; and lines connecting centers of the three sub-pixels form a triangle. This setting allows the border lines of the pixel regions P1 and P2 and the light transmission region T to be the folded lines.

Figure 2A:
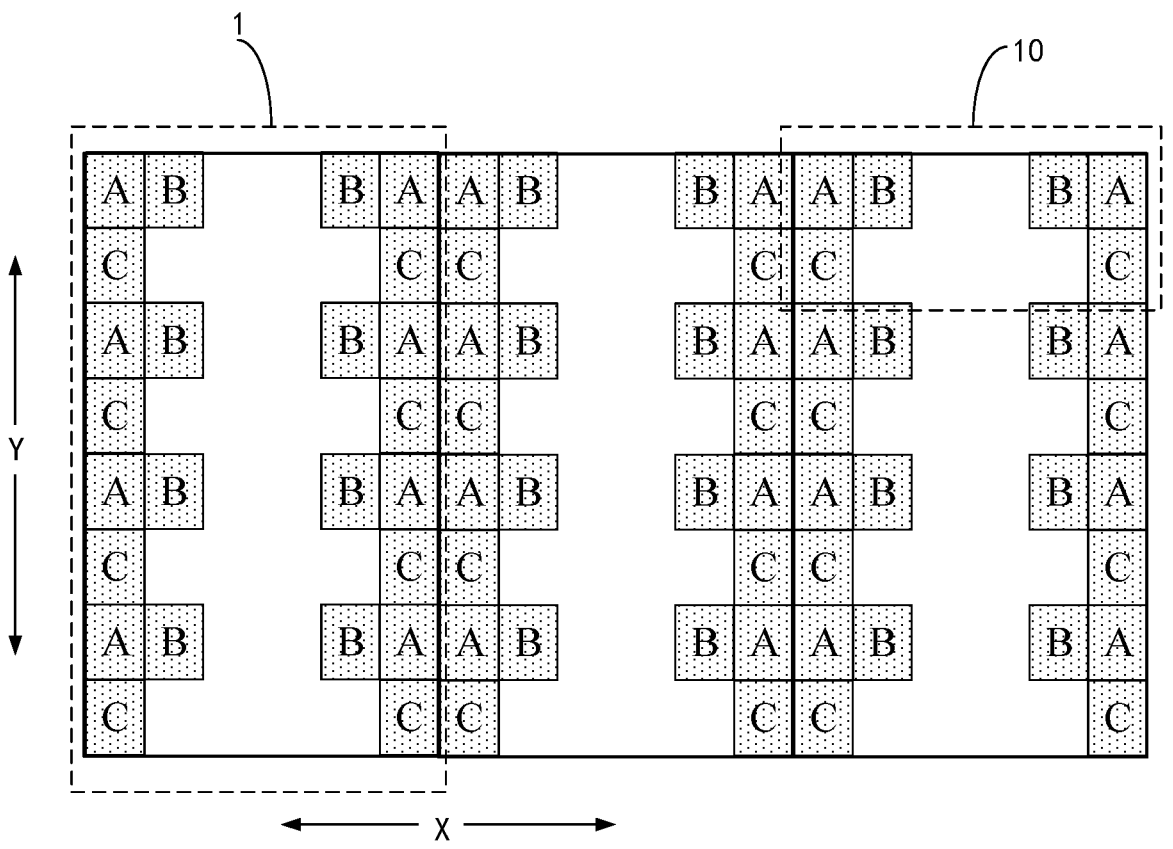
FIG. 2A is another partial schematic structural diagram of a display substrate provided by an embodiment of the present disclosure.
Figure 2B:
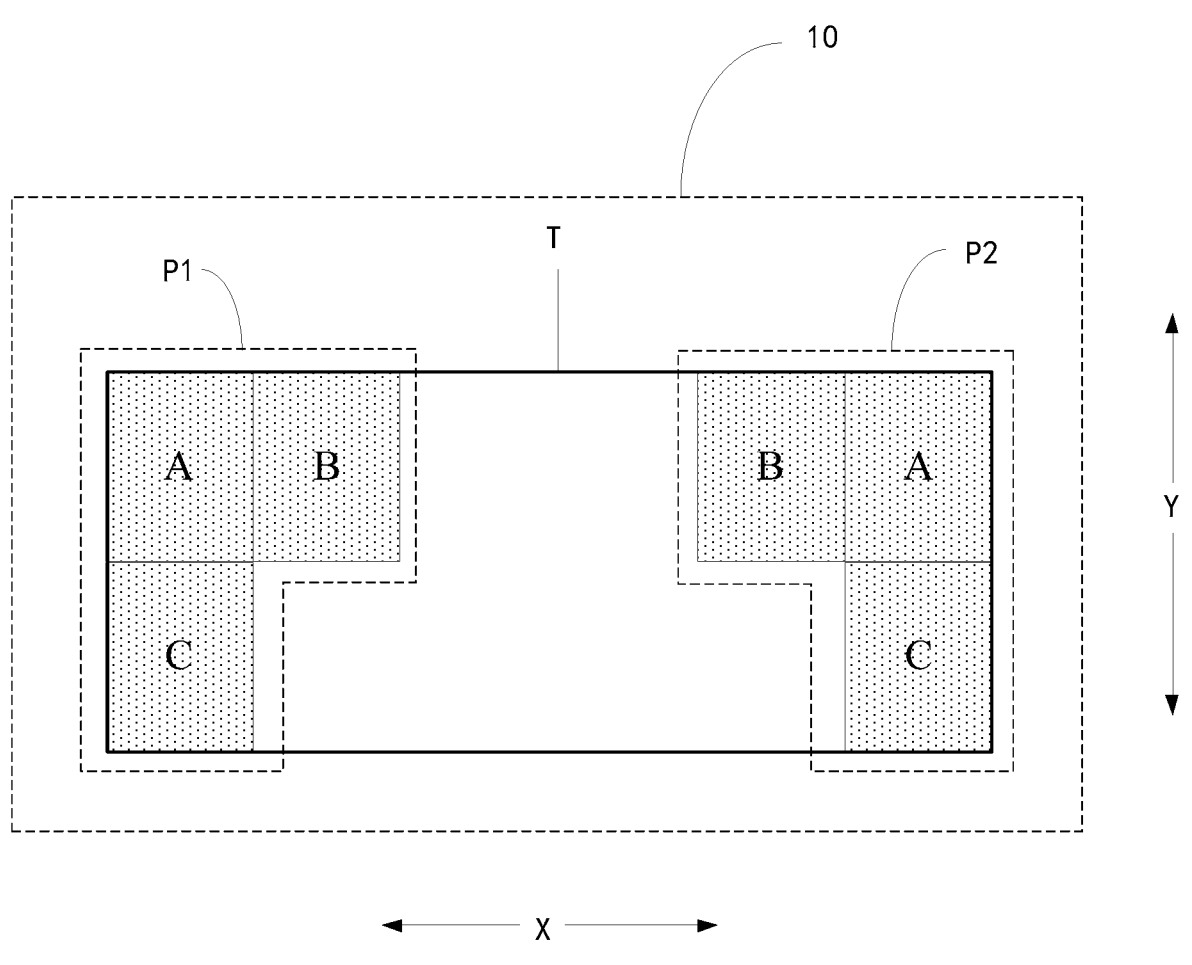
FIG. 2B is a schematic structural diagram of a pixel repeat unit in the display substrate shown in FIG. 2A.
Figure 4A:
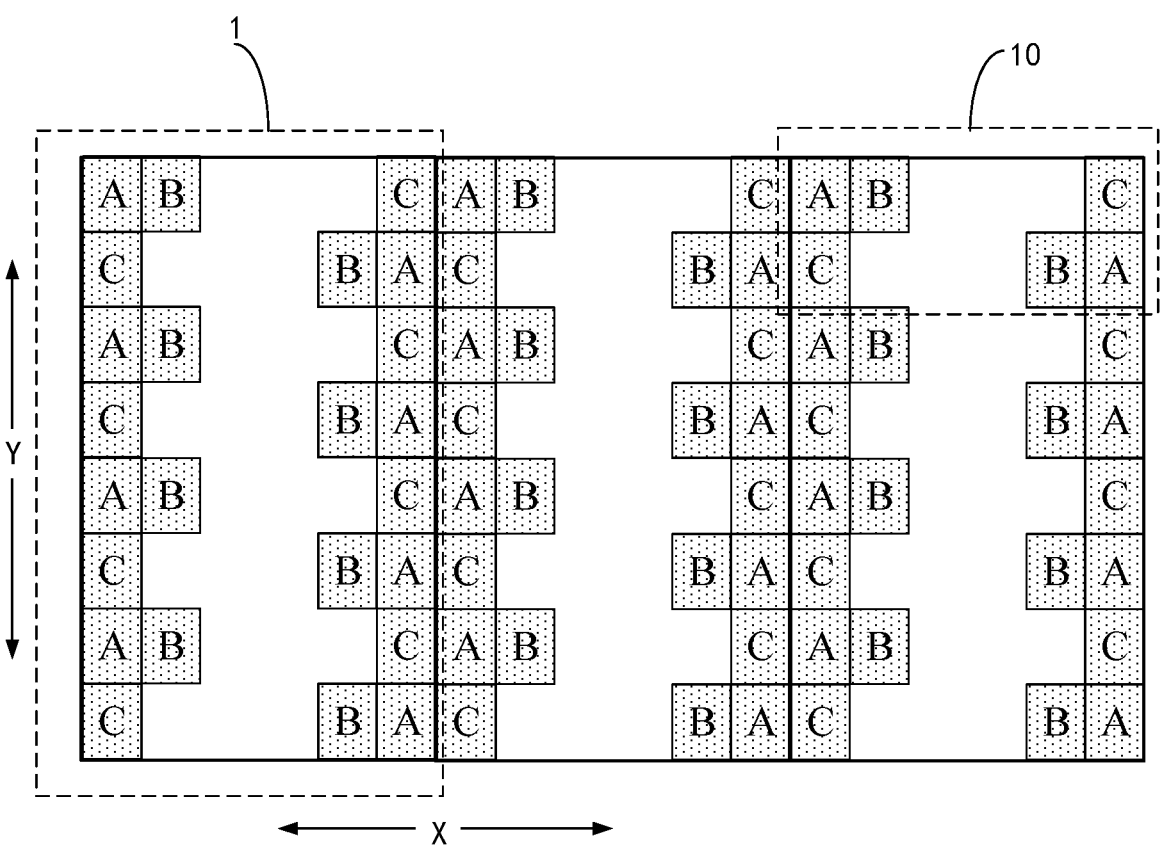
FIG. 4A is another partial schematic structural diagram of a display substrate provided by an embodiment of the present disclosure.
Figure 4B:
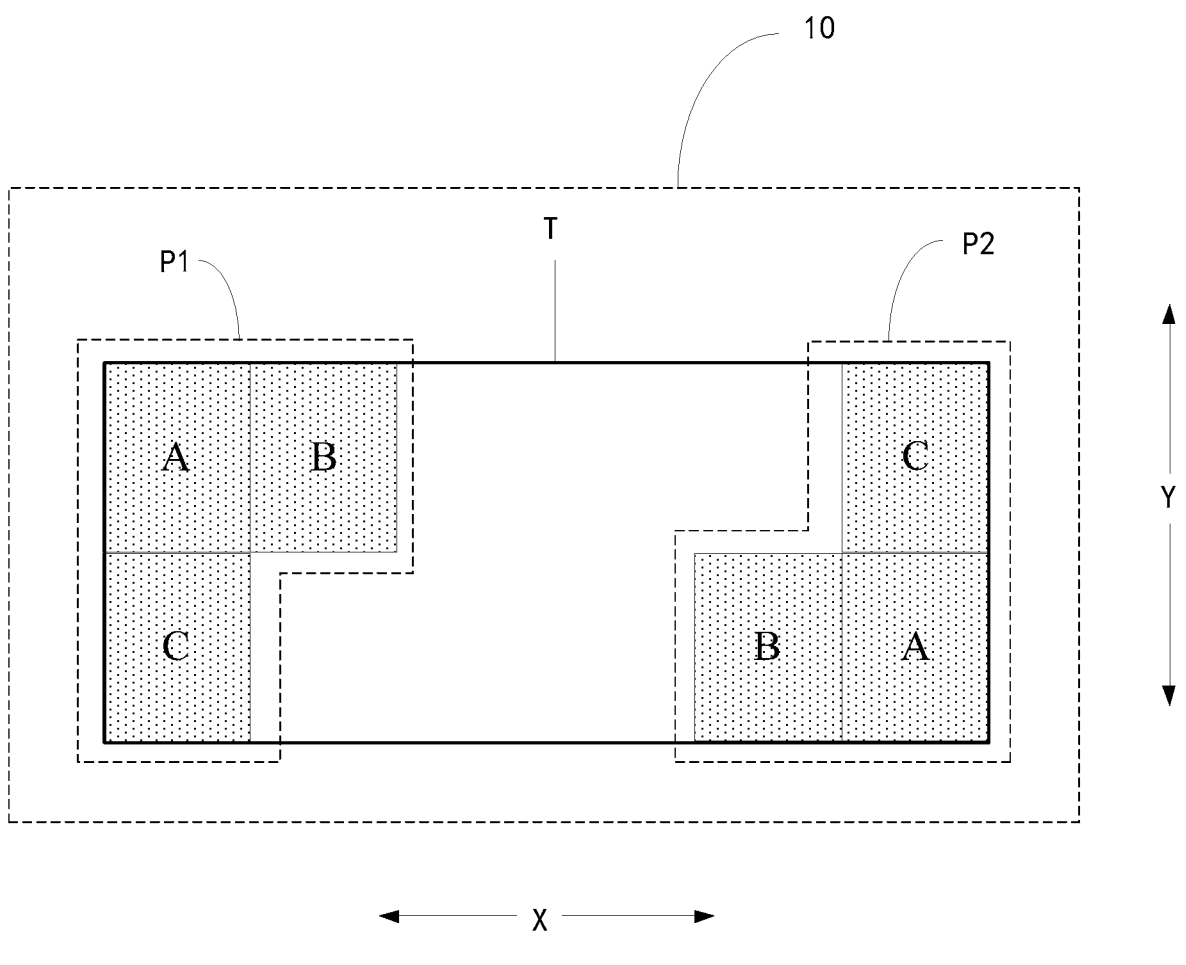
FIG. 4B is a schematic structural diagram of a pixel repeat unit in the display substrate shown in FIG. 4A.

Optionally, in the display substrate provided by the embodiments of the present disclosure, as shown in FIG. 2A, FIG. 2B, FIG. 4A, and FIG. 4B, FIG. 2B is a schematic structural diagram of a pixel repeat unit in the display substrate shown in FIG. 2A, and FIG. 4B is a schematic structural diagram of a pixel repeat unit in the display substrate shown in FIG. 4A; and in each of the pixel repeat units 10, the three sub-pixels in each of the pixel regions P1 and P2 are arranged as follows: the first sub-pixel A and the second sub-pixel B are adjacently arranged in the first direction X, the third sub-pixel C and the first sub-pixel A are adjacently arranged in the second direction Y, and the second sub-pixel B and the third sub-pixel C are both arranged adjacent to the light transmission region T in the first direction X.

Figure 3A:
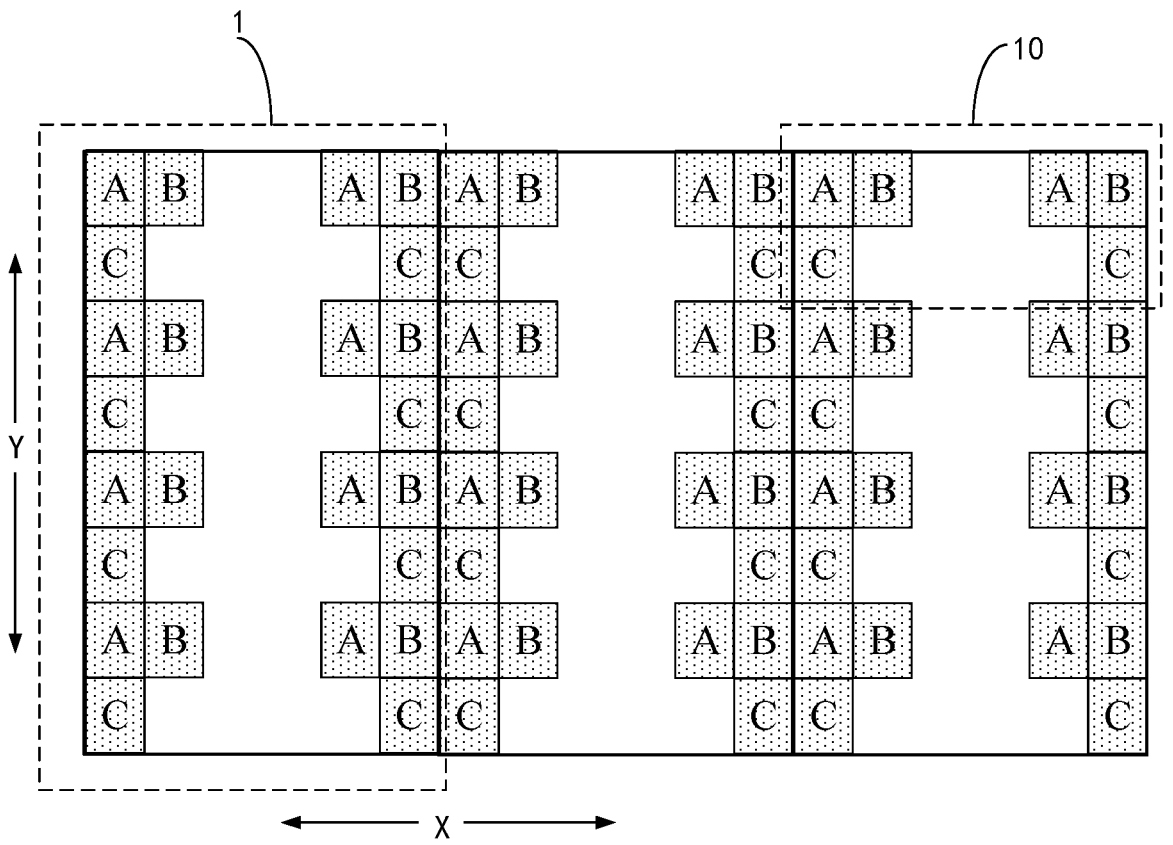
FIG. 3A is another partial schematic structural diagram of a display substrate provided by an embodiment of the present disclosure.
Figure 3B:
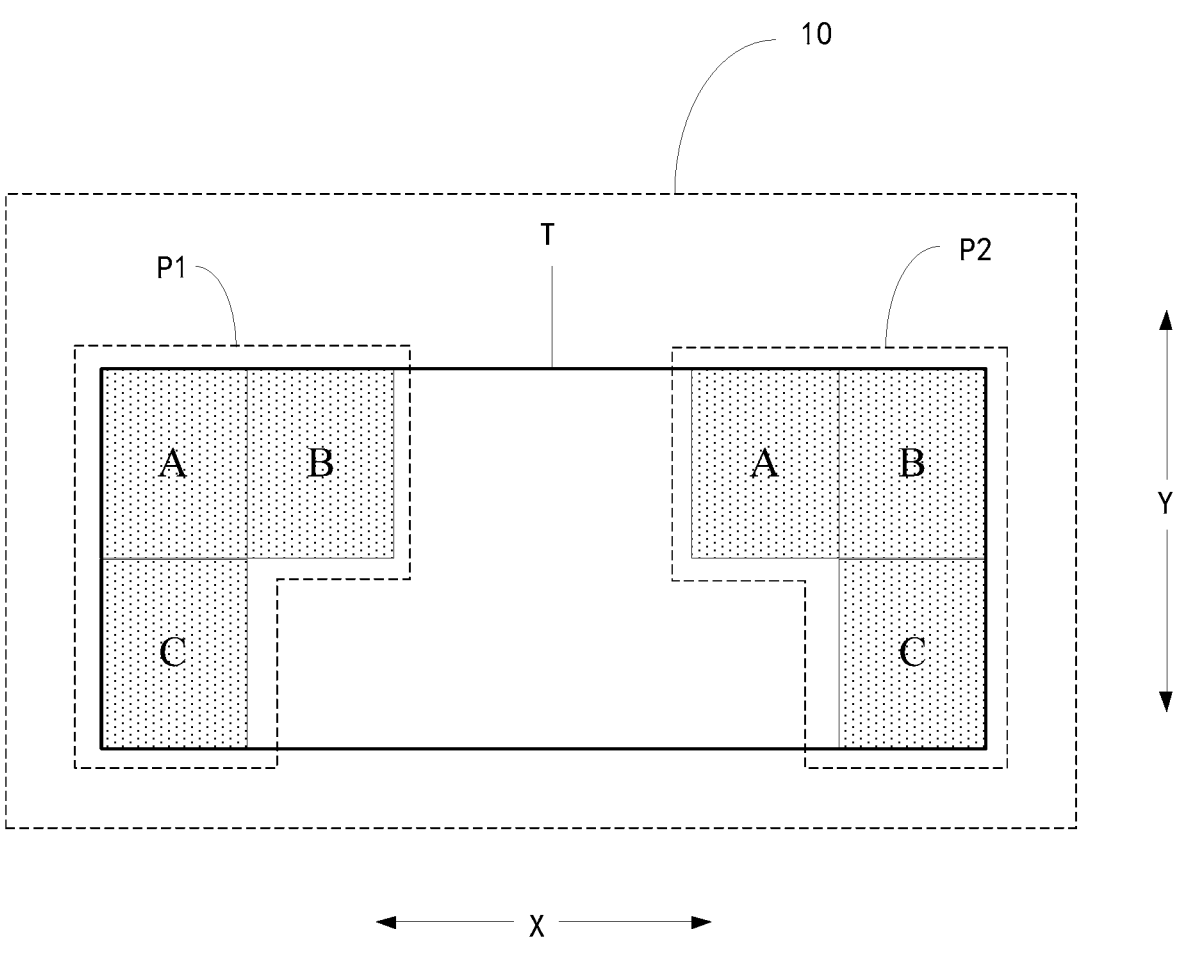
FIG. 3B is a schematic structural diagram of a pixel repeat unit in the display substrate shown in FIG. 3A.
Figure 5A:
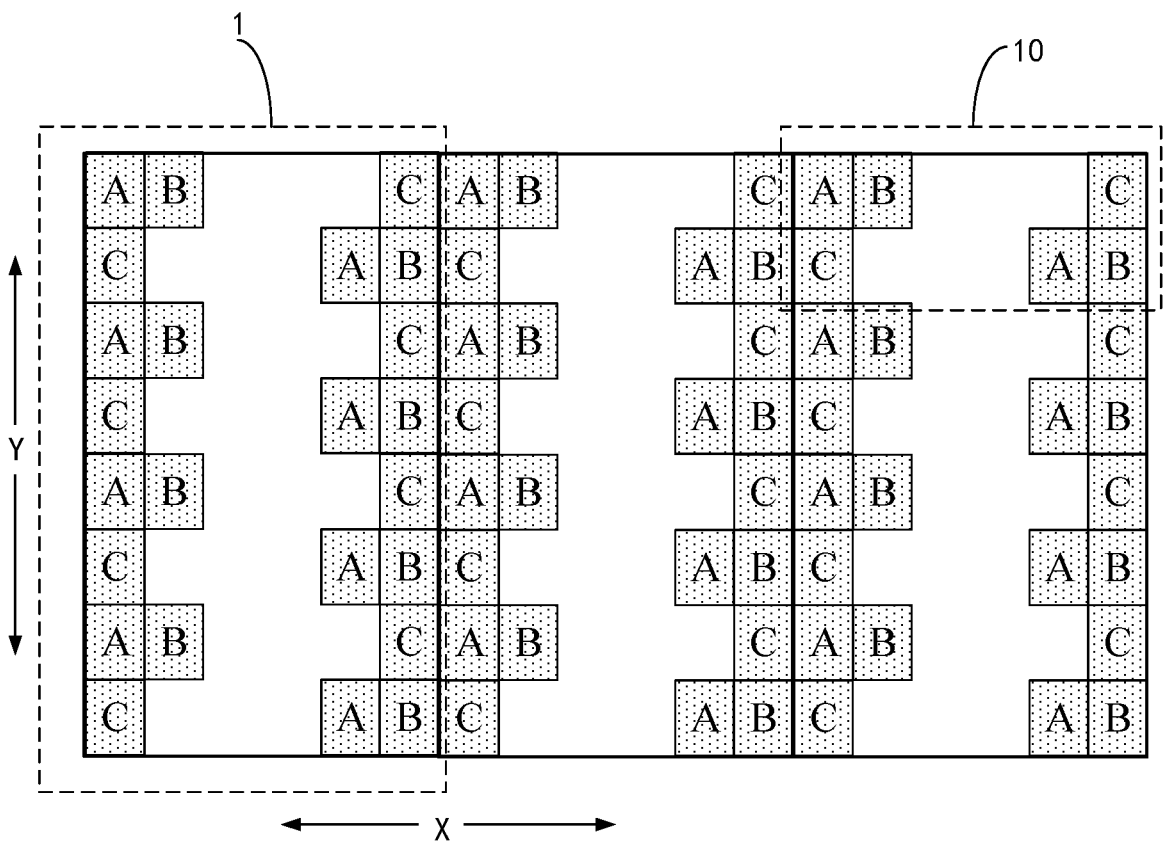
FIG. 5A is another partial schematic structural diagram of a display substrate provided by an embodiment of the present disclosure.
Figure 5B:
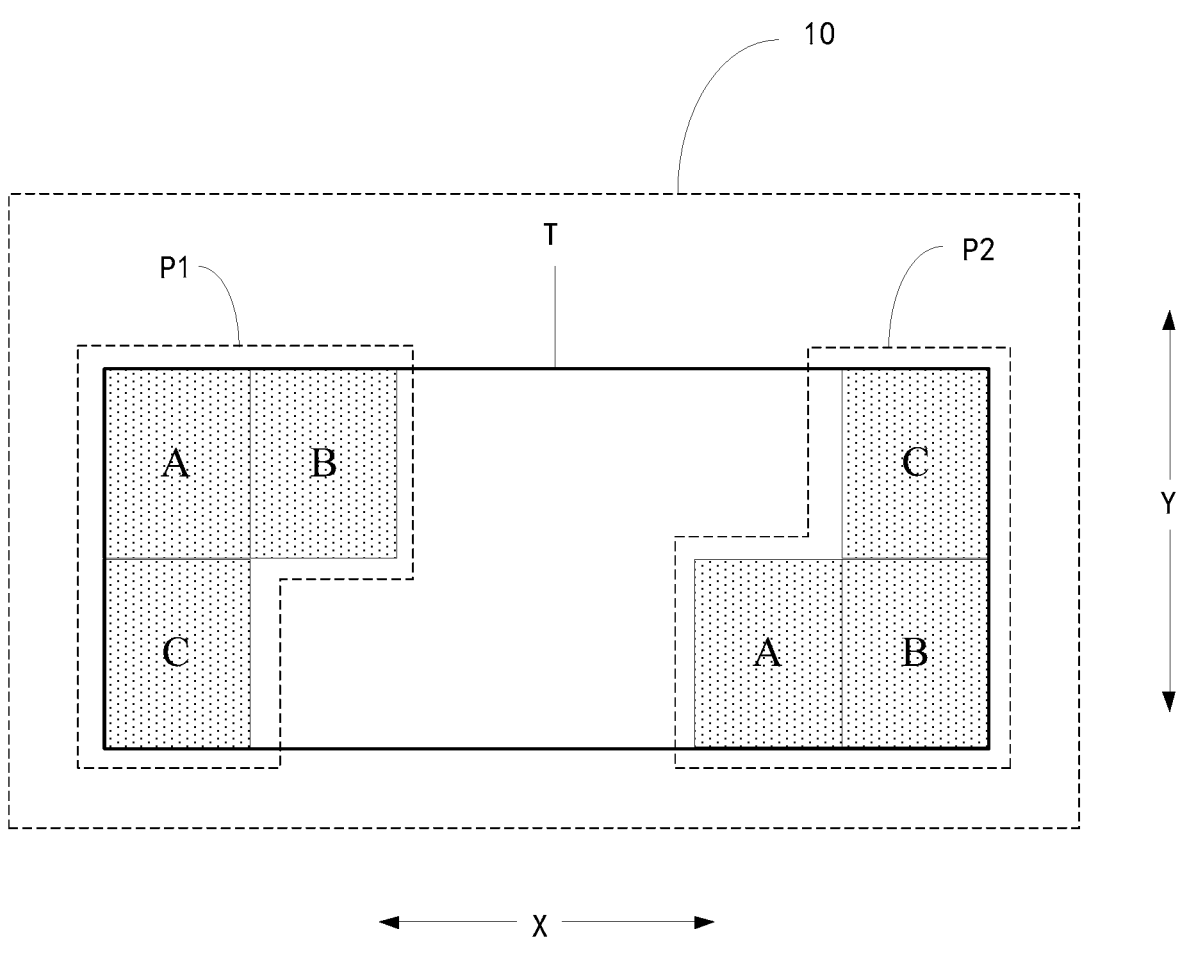
FIG. 5B is a schematic structural diagram of a pixel repeat unit in the display substrate shown in FIG. 5A.

Optionally, in the display substrate provided by the embodiments of the present disclosure, as shown in FIG. 3A, FIG. 3B, FIG. 5A, and FIG. 5B, FIG. 3B is a schematic structural diagram of a pixel repeat unit in the display substrate shown in FIG. 3A, and FIG. 5B is a schematic structural diagram of a pixel repeat unit in the display substrate shown in FIG. 5A; in each of the pixel repeat units 10, the three sub-pixels in one pixel region P1 are arranged as follows: the first sub-pixel A and the second sub-pixel B are adjacently arranged in the first direction X, the third sub-pixel C and the first sub-pixel A are adjacently arranged in the second direction Y, and the second sub-pixel B and the third sub-pixel C are both arranged adjacent to the light transmission region T in the first direction X; and the three sub-pixels in the other pixel region P2 are arranged as follows: the first sub-pixel A and the second sub-pixel B are adjacently arranged in the first direction X, the third sub-pixel C and the second sub-pixel B are adjacently arranged in the second direction Y, and the first sub-pixel A and the third sub-pixel C are both arranged adjacent to the light transmission region T in the first direction X.

Optionally, in the display substrate provided by the embodiments of the present disclosure, as shown in FIG. 4A, FIG. 4B, FIG. 5A, and FIG. 5B, in each of the pixel repeat units 10, the third sub-pixel C in one pixel region P1 and the first sub-pixel A and the second sub-pixel B in the other pixel region P2 are arranged in the first direction X, so as to ensure that a transparent region in each of sub-pixel rows occupies the same area and that the number of sub-pixels in each of the sub-pixel rows is the same, thereby ensuring display quality.

Figure 10A:
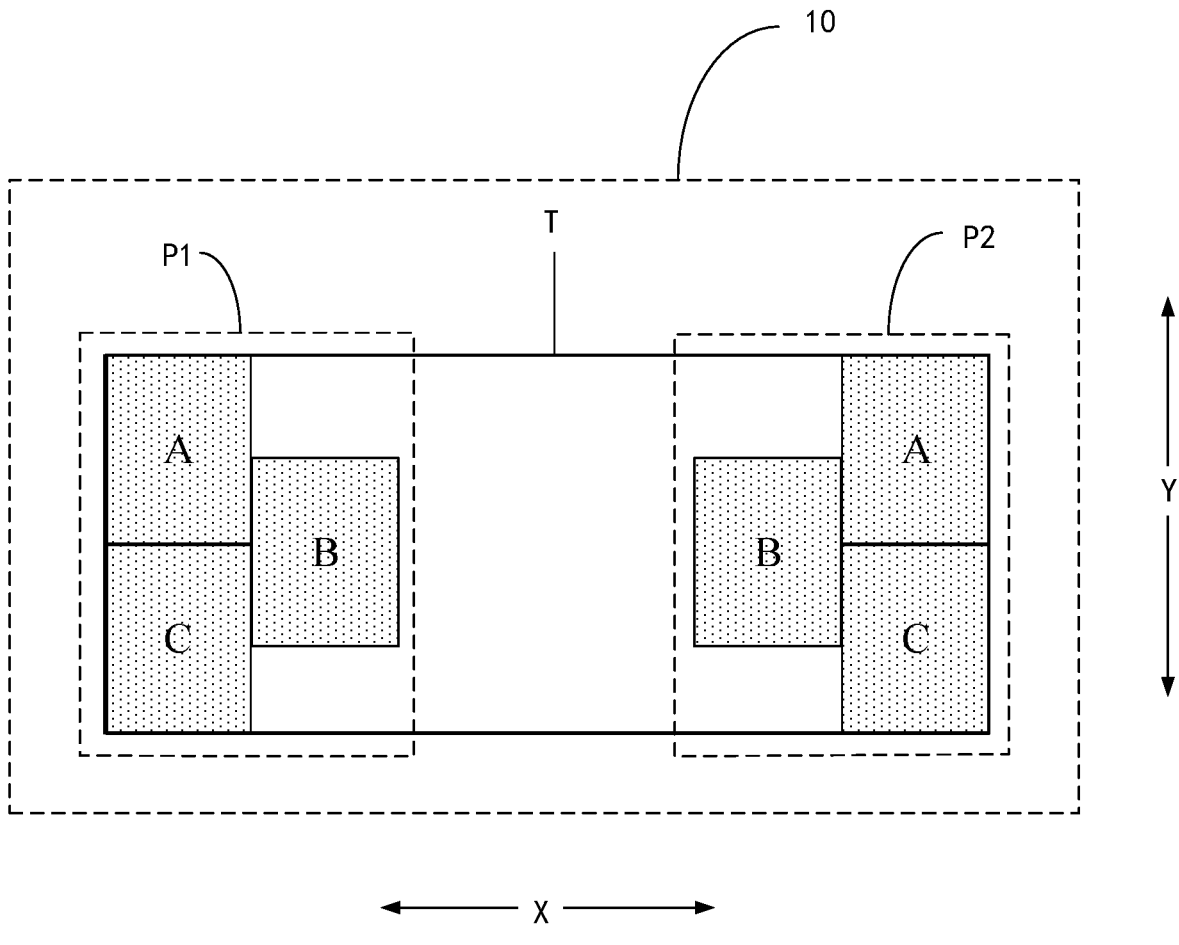
FIG. 10A to FIG. 10D are respectively schematic structural diagrams of a pixel repeat unit in a display substrate provided by embodiments of the present disclosure.
Figure 10B:
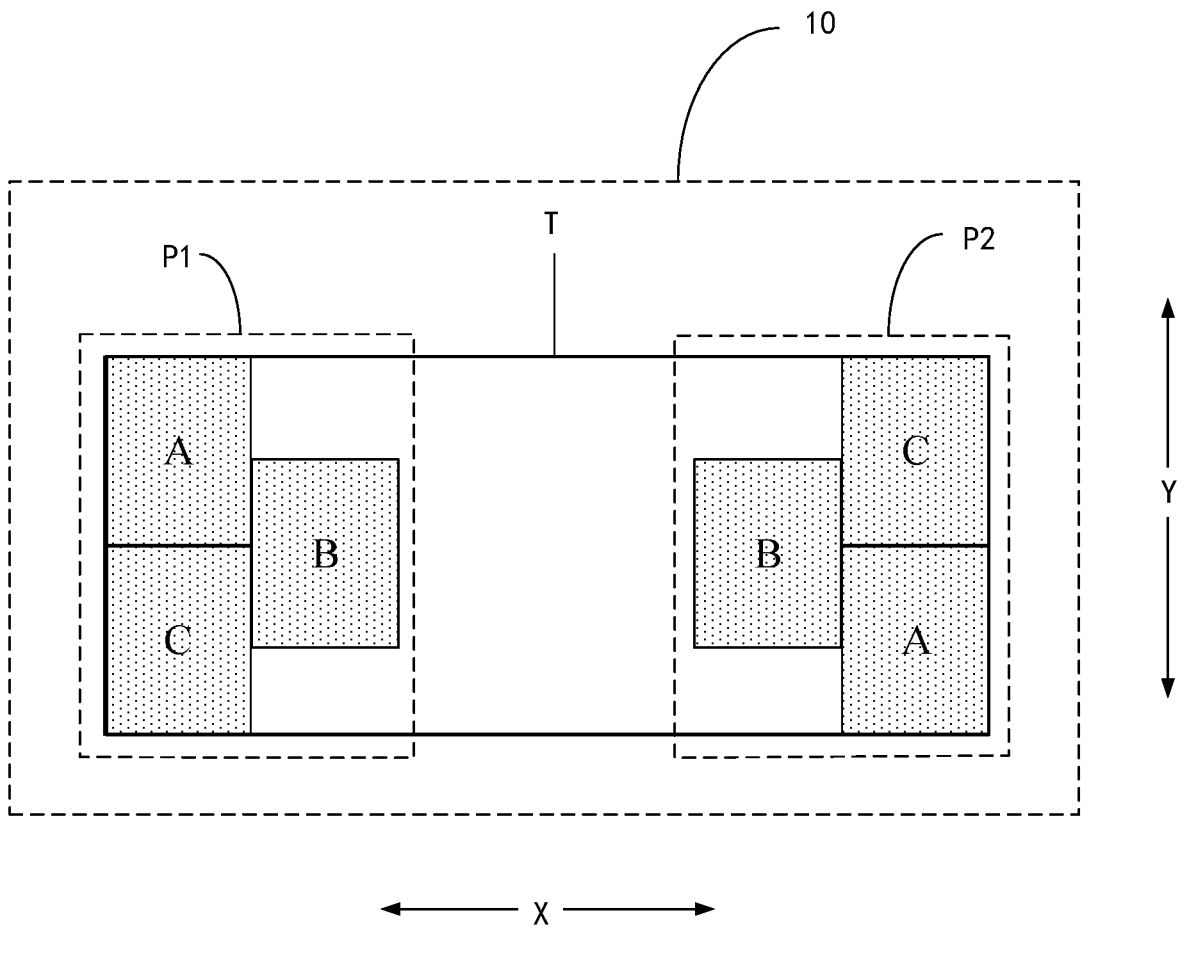

Optionally, in the display substrate provided by the embodiments of the present disclosure, as shown in FIGS. 10A and FIG. 10B, in each of the pixel repeat units 10, the three sub-pixels in each of the pixel regions P1 and P2 are arranged as follows: the third sub-pixel C and the first sub-pixel A are adjacently arranged in the second direction Y; the second sub-pixel B is arranged adjacent to the first sub-pixel A and the third sub-pixel C in the first direction X; and the first sub-pixel A, the second sub-pixel B and the third sub-pixel C are all arranged adjacent to the light transmission region T in the first direction.

Figure 10C:
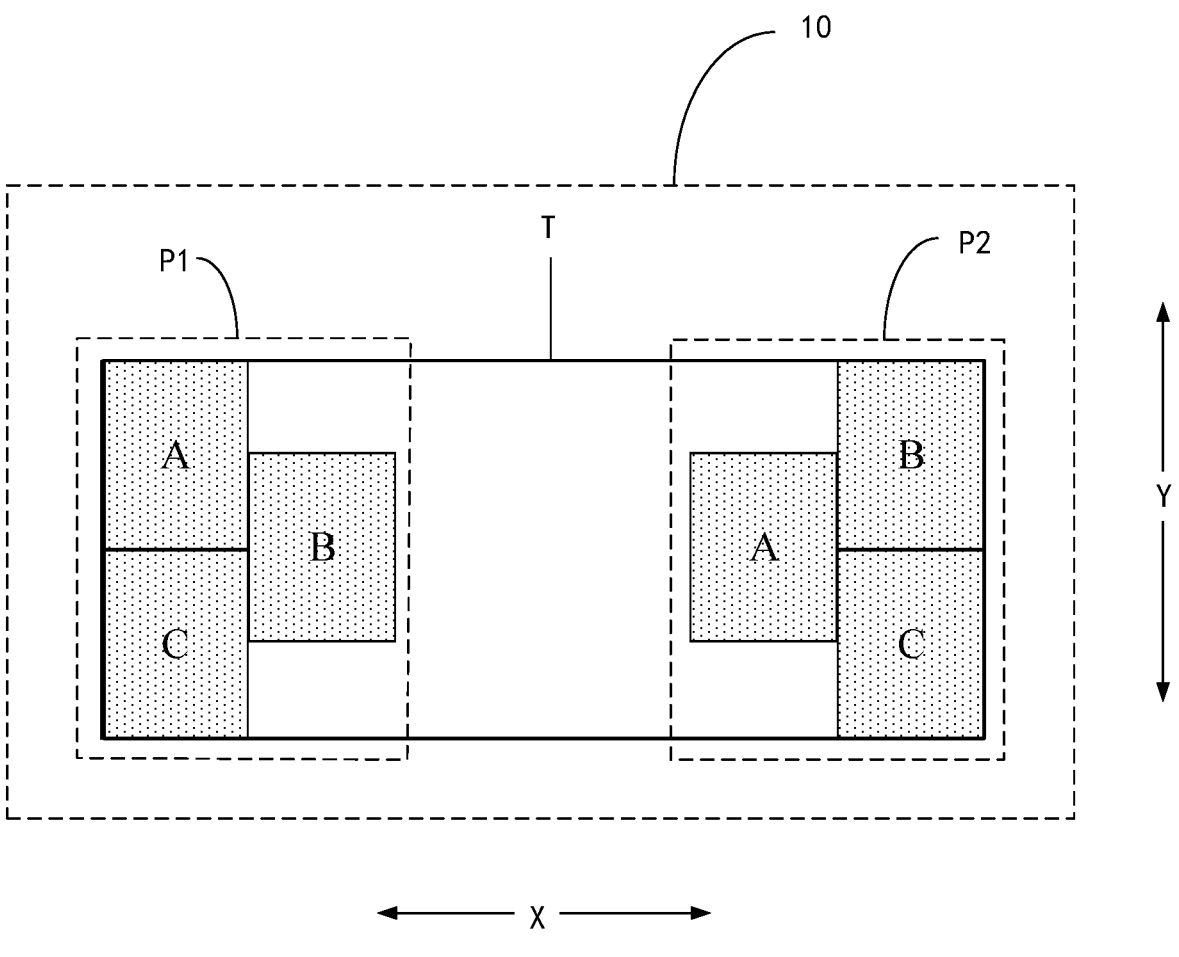
Figure 10D:
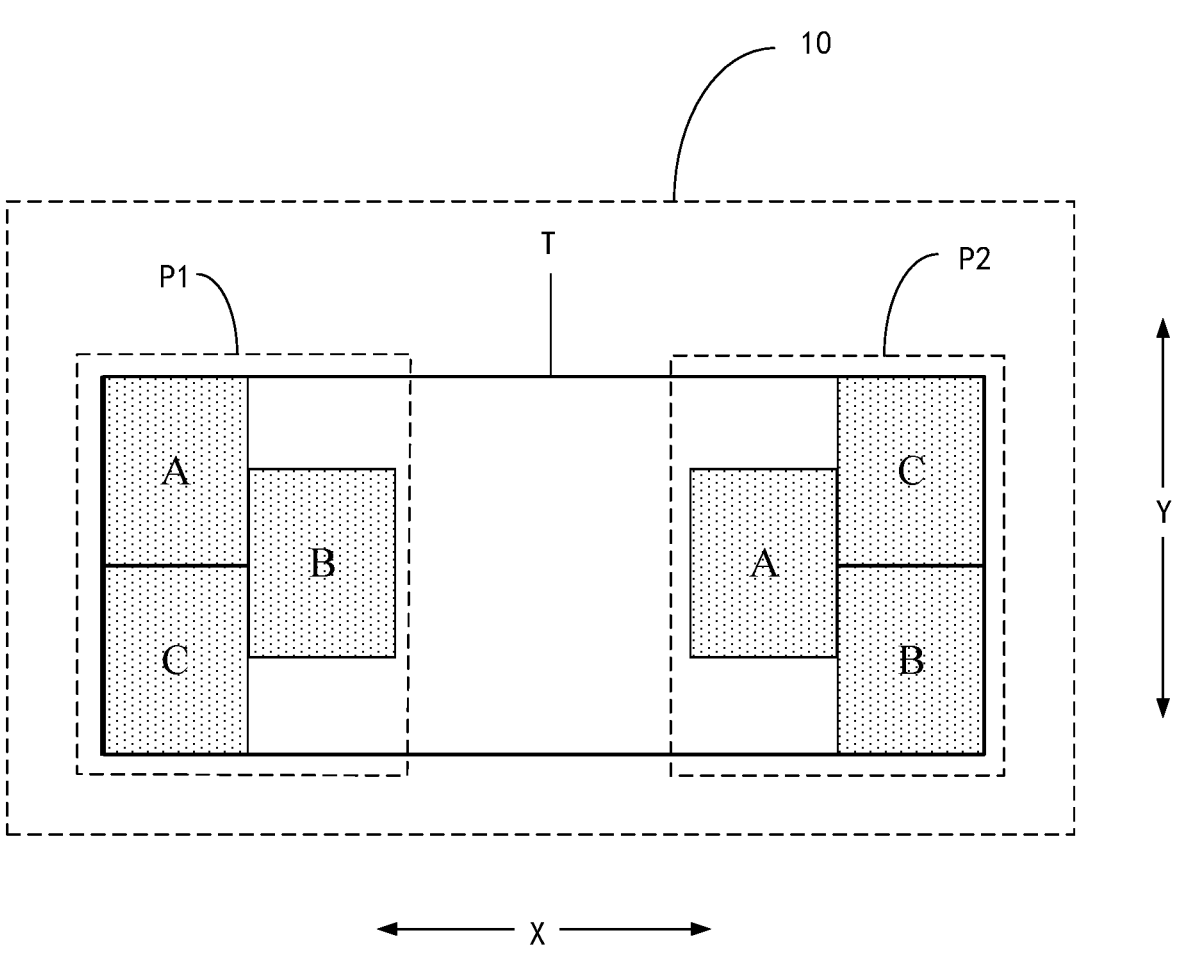

Optionally, in the display substrate provided by the embodiments of the present disclosure, as shown in FIG. 10C and FIG. 10D, in each of the pixel repeat units 10, the three sub-pixels in one pixel region P1 are arranged as follows: the third sub-pixel C and the first sub-pixel A are adjacently arranged in the second direction Y; the second sub-pixel B is arranged adjacent to the first sub-pixel A and the third sub-pixel C in the first direction X; and the first sub-pixel A, the second sub-pixel B and the third sub-pixel C are all arranged adjacent to the light transmission region T in the first direction X; and the three sub-pixels in the other pixel region P2 are arranged as follows: the third sub-pixel C and the second sub-pixel B are adjacently arranged in the second direction Y; the first sub-pixel A is arranged adjacent to the second sub-pixel B and the third sub-pixel C in the first direction X; and the first sub-pixel A, the second sub-pixel B and the third sub-pixel C are all arranged adjacent to the light transmission region T in the first direction X.

Figures 6A, 6B:
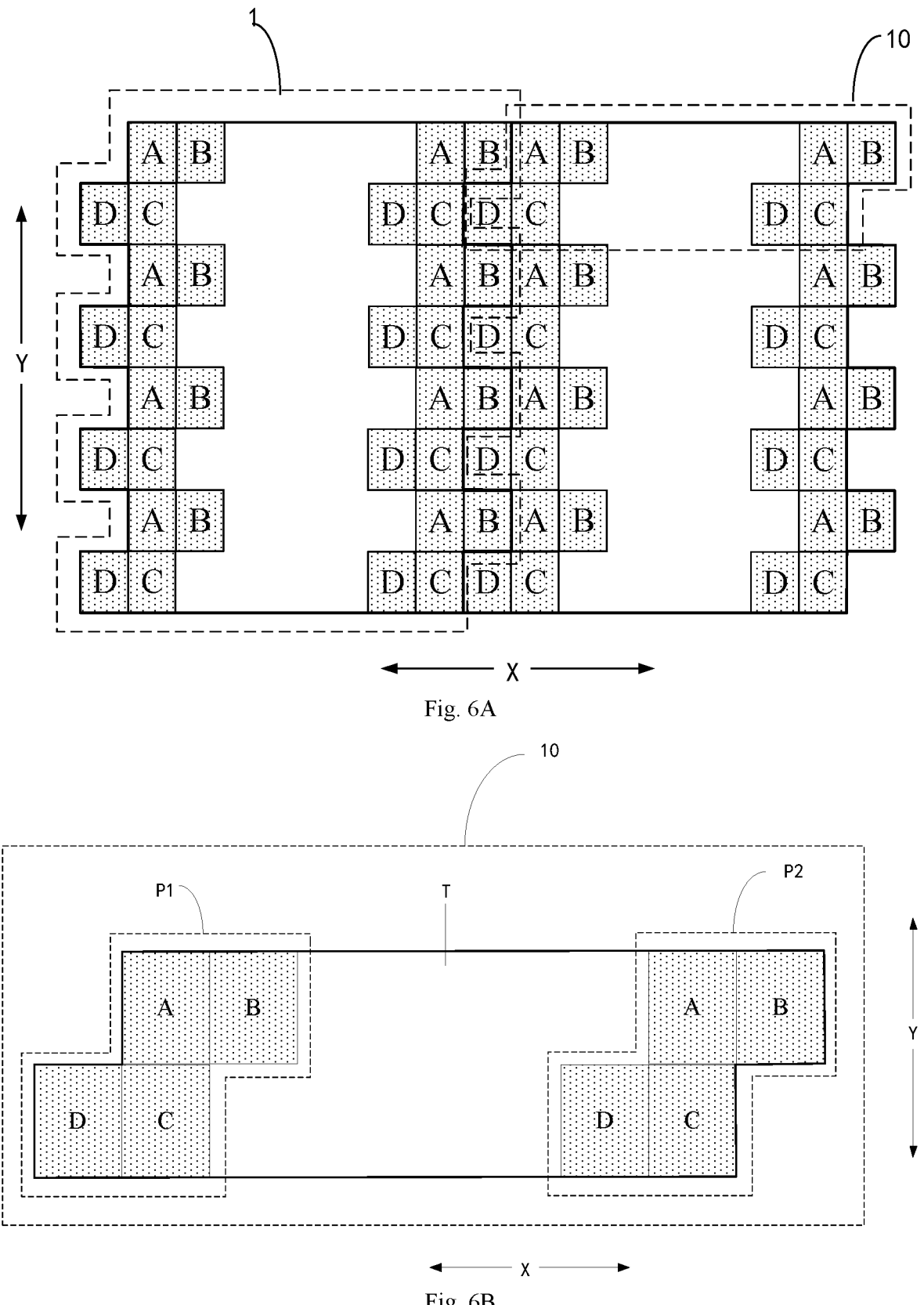
FIG. 6A is another partial schematic structural diagram of a display substrate provided by an embodiment of the present disclosure.
FIG. 6B is a schematic structural diagram of a pixel repeat unit in the display substrate shown in FIG. 6A.
Figures 7A, 7B:
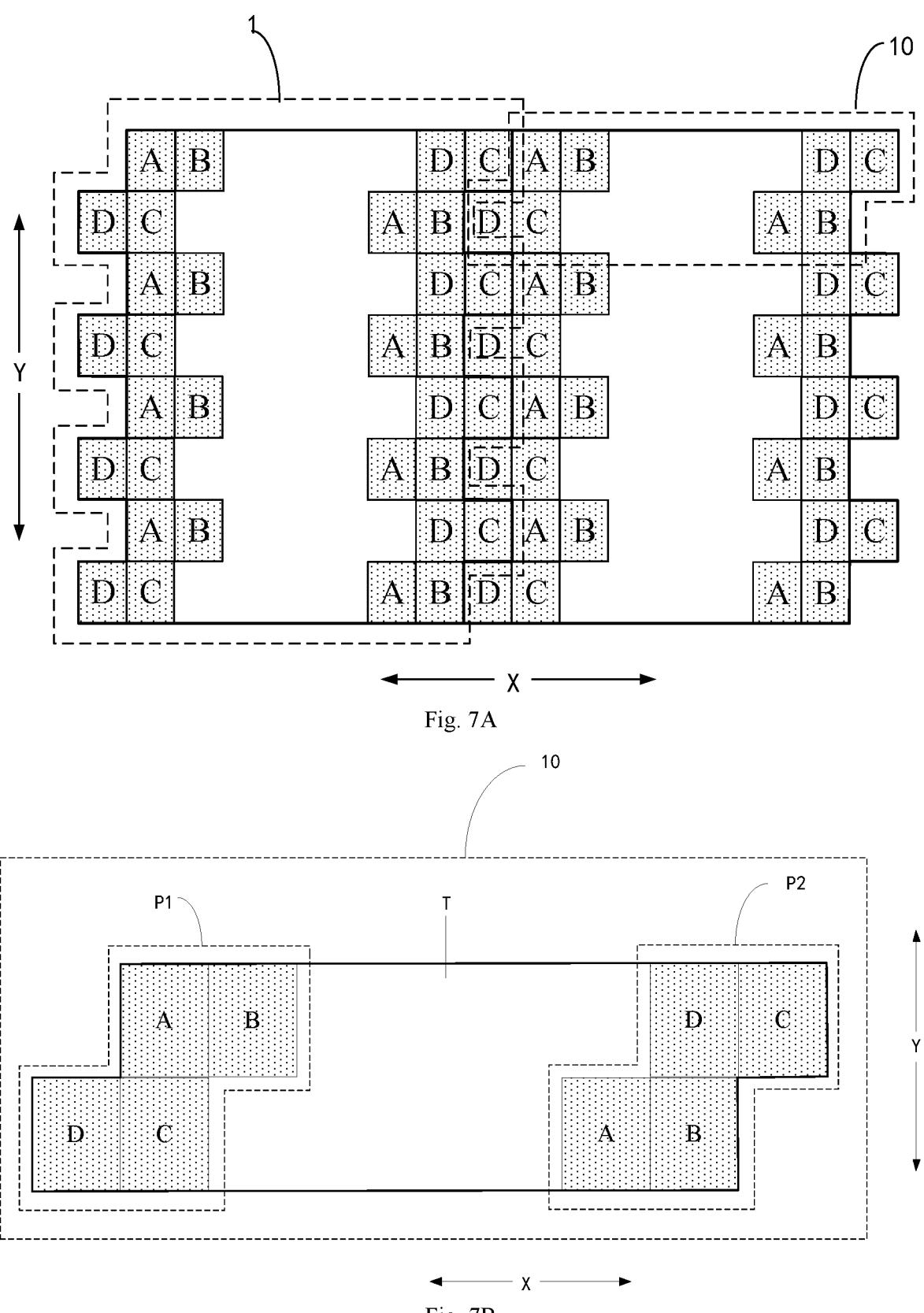
FIG. 7A is another partial schematic structural diagram of a display substrate provided by an embodiment of the present disclosure.
FIG. 7B is a schematic structural diagram of a pixel repeat unit in the display substrate shown in FIG. 7A.
Figures 8A, 8B:
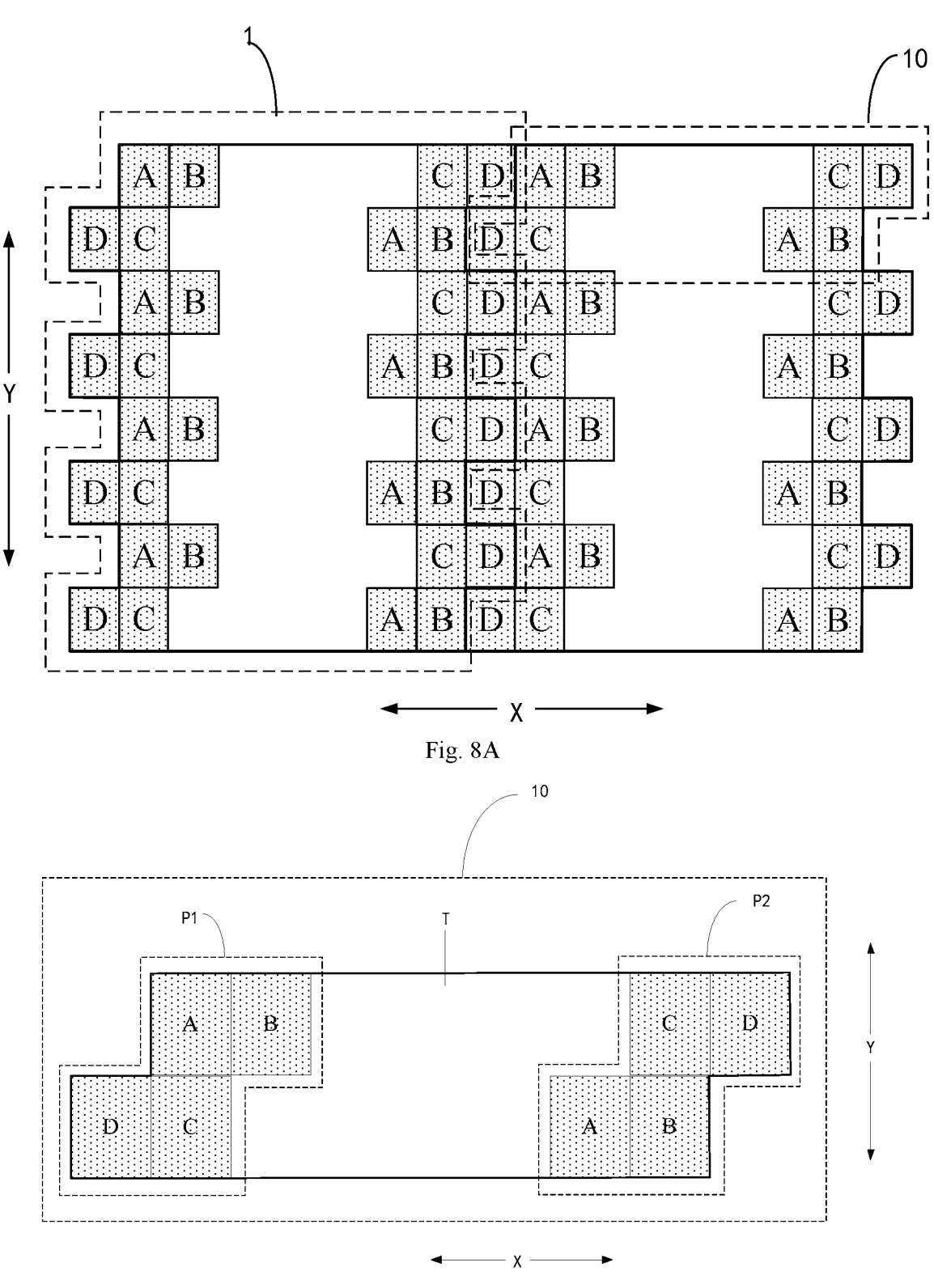
FIG. 8A is another partial schematic structural diagram of a display substrate provided by an embodiment of the present disclosure.
FIG. 8B is a schematic structural diagram of a pixel repeat unit in the display substrate shown in FIG. 8A.
Figures 9A, 9B:
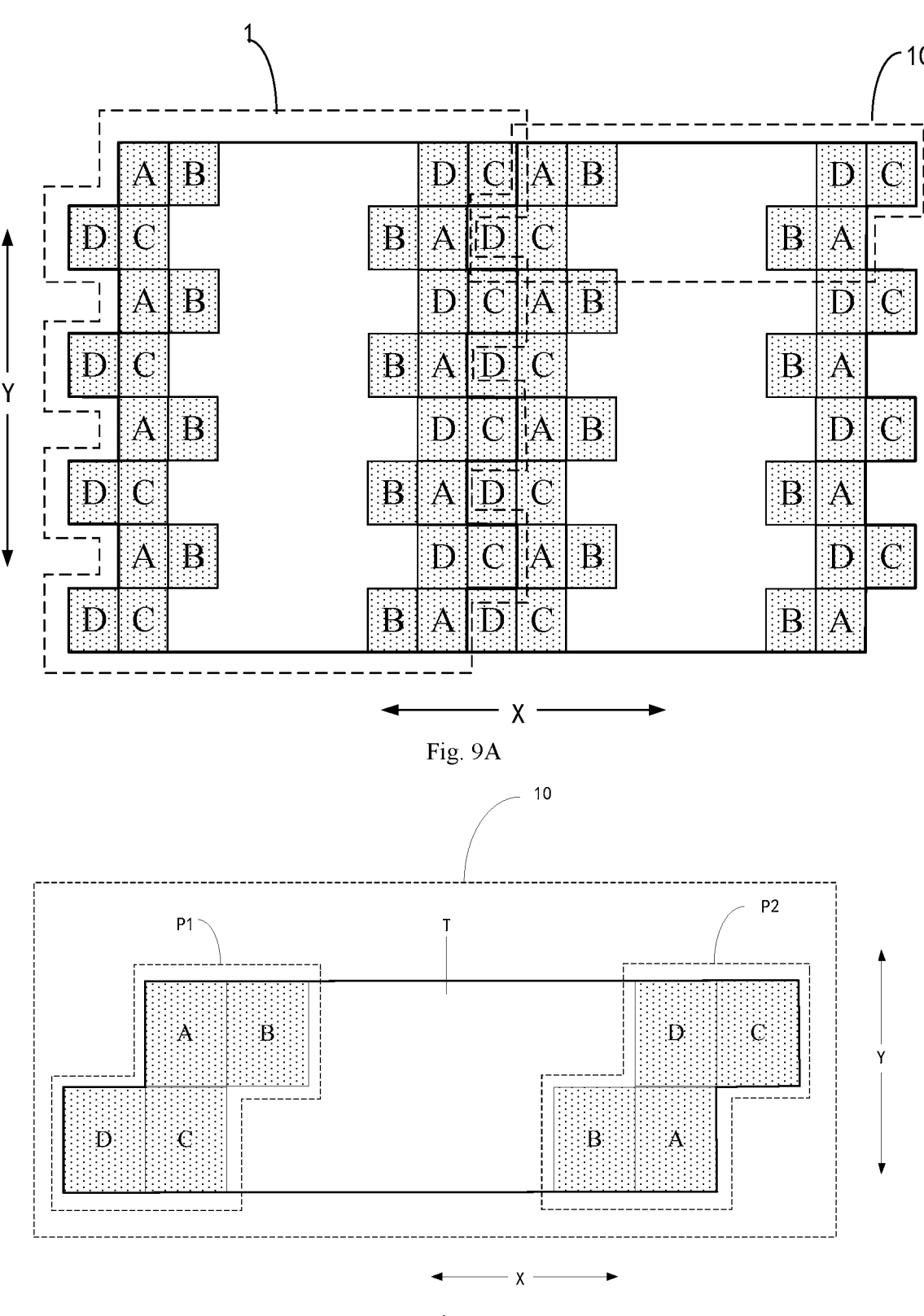
FIG. 9A is another partial schematic structural diagram of a display substrate provided by an embodiment of the present disclosure.
FIG. 9B is a schematic structural diagram of a pixel repeat unit in the display substrate shown in FIG. 9A.

Optionally, in the display substrate provided by the embodiments of the present disclosure, as shown in FIG. 6A-FIG. 6B, FIG. 7A-FIG. 7B, FIG. 8A-FIG. 8B, and FIG. 9A-FIG. 9B, FIG. 6B is a schematic structural diagram of a pixel repeat unit in the display substrate shown in FIG. 6A, FIG. 7B is a schematic structural diagram of a pixel repeat unit in the display substrate shown in FIG. 7A, FIG. 8B is a schematic structural diagram of a pixel repeat unit in the display substrate shown in FIG. 8A, and FIG. 9B is a schematic structural diagram of a pixel repeat unit in the display substrate shown in FIG. 9A; and each of the pixel regions P1 and P2 includes a first sub-pixel A, a second sub-pixel B, a third sub-pixel C and a fourth sub-pixel D, and lines connecting centers of the fourth sub-pixels form a parallelogram. This setting allows the border lines of the pixel regions P1 and P2 and the light transmission region T to be folded lines.

Optionally, in the display substrate provided by the embodiments of the present disclosure, as shown in FIG. 6A-FIG. 6B, FIG. 7A-FIG. 7B, FIG. 8A-FIG. 8B, and FIG. 9A-FIG. 9B, in each of the pixel repeat units 10, the four sub-pixels in each of the pixel regions P1 and P2 are arranged as follows: the first sub-pixel A and the second sub-pixel B are adjacently arranged in the first direction X, and the third sub-pixel C and the fourth sub-pixel D are adjacently arranged in the first direction X.

Optionally, in the display substrate provided by the embodiments of the present disclosure, as shown in FIG. 6A to FIG. 9B, in each of the pixel regions P1 and P2, one of the first sub-pixel A and the second sub-pixel B is arranged adjacent to one of the third sub-pixel C and the fourth sub-pixel D in the second direction Y; and the other of the first sub-pixel A and the second sub-pixel B and the other of the third sub-pixel C and the fourth sub-pixel D are arranged in a staggered mode. For example, in the pixel region P1 or P2, the first sub-pixel A and the third sub-pixel C are adjacently arranged in the second direction Y, and the second sub-pixel B is not adjacent to the fourth sub-pixel D; the first sub-pixel A and the fourth sub-pixel D are adjacently arranged in the second direction Y, and the second sub-pixel B is not adjacent to the third sub-pixel C; the second sub-pixel B and the third sub-pixel C are adjacently arranged in the second direction Y, and the first sub-pixel A is not adjacent to the fourth sub-pixel D; or the second sub-pixel B and the fourth sub-pixel D are adjacently arranged in the second direction Y, and the first sub-pixel A is not adjacent to the third sub-pixel C.

Optionally, in the display substrate provided by the embodiments of the present disclosure, as shown in FIG. 7A-FIG. 7B, FIG. 8A-FIG. 8B, and FIG. 9A-FIG. 9B, in each of the pixel repeat units 10, the third sub-pixel C in one of the pixel regions P1 and P2 and the second sub-pixel B in the other of the pixel regions P1 and P2 are arranged in the first direction X. In this way, it can be ensured that in the same sub-pixel row, the number of sub-pixels of different colors is the same and that colors of the sub-pixels adjacently arranged in the first direction are not the same, thereby ensuring display quality.

During specific implementation, in the display substrate provided by the embodiments of the present disclosure, the first sub-pixel, the second sub-pixel and the third sub-pixel have different colors and may be a red sub-pixel, a blue sub-pixel and a green sub-pixel respectively; and the fourth sub-pixel may be a white sub-pixel or a yellow sub-pixel, etc. The fourth sub-pixel may also be any one of a red sub-pixel, a blue sub-pixel or a green sub-pixel, for example, the fourth sub-pixel is the blue sub-pixel, which is not limited herein. That is, two of the first sub-pixel, the second sub-pixel, the third sub-pixel and the fourth sub-pixel are sub-pixels with the same light emitting color.

During specific implementation, the display substrate provided by the embodiments of the present disclosure may be applied to any product or component with a transparent display function, such as a vehicle-mounted product, smart home and store window, which is not limited herein.

Based on the same inventive concept, embodiments of the present disclosure further provide a display apparatus, including any above display substrate provided by the embodiments of the present disclosure. Since the principle for solving problems of the display apparatus is similar to that of the above display substrate, implementation of the display apparatus may refer to the embodiments of the above display substrate, and repetitions are omitted herein.

In the display substrate and the display apparatus provided by the embodiments of the present disclosure, each of the pixel repeat units includes the two pixel regions arranged in the first direction and the light transmission region located between the two pixel regions; where at least three sub-pixels are adjacently arranged in each of the pixel regions; and the area of the light transmission region is equal to twice the area of a light transmission region corresponding to a single pixel region. It's regarded as the situation where light transmission regions which respectively correspond to two pixel regions in the related art are spliced together and the spliced light transmission region is placed between the two pixel regions. On the basis that the total area of the light transmission region in the display substrate is not increased, the area of each independent light transmission region in a display panel is increased to twice the area of a single light transmission region in an existing display substrate, thereby reducing the diffraction phenomenon of the display substrate, and improving the problem of ghosting.

Obviously, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display substrate, comprising a plurality of pixel repeat groups arranged sequentially in a first direction;

wherein each of the plurality of pixel repeat groups comprises a plurality of pixel repeat units arranged in a second direction;

each of the plurality of pixel repeat units comprises two pixel regions that are a first pixel region and a second pixel region arranged in the first direction and a first light transmission region arranged between the first pixel region and the second pixel region;

at least three sub-pixels are adjacently arranged in each of the pixel regions;

for two pixel repeat units that are adjacent to each other in the first direction: a first pixel region in one pixel repeat unit connects to a second pixel region in another pixel repeat unit, and does not connect to a light transmission region in the another pixel repeat unit;

for two pixel repeat units that are adjacent to each other in the second direction: a first pixel region, a second pixel region, and a first light transmission region in one pixel repeat unit connect to a first pixel region, a second pixel region, and a first light transmission region in another pixel repeat unit, respectively;

an area of the first light transmission region is equal to twice an area of a second light transmission region corresponding to one of the pixel regions; and the area of the second light transmission region corresponding to the one of the pixel regions is equal to a total area of all first light transmission regions in the display substrate divided by a quantity of all pixel regions in the display substrate;

wherein in each of the plurality of pixel repeat units, border lines of the pixel regions and the first light transmission region are folded lines.

2. The display substrate according to claim 1, wherein the first pixel region and the second pixel region each comprise a first sub-pixel, a second sub-pixel and a third sub-pixel; and lines connecting centers of the first sub-pixel, the second sub-pixel and the third sub-pixel form a triangle.

3. The display substrate according to claim 2, wherein in each of the first pixel region and the second pixel region, the first sub-pixel and the second sub-pixel are adjacently arranged in the first direction, the third sub-pixel and the first sub-pixel are adjacently arranged in the second direction, and the second sub-pixel and the third sub-pixel are both arranged adjacent to the first light transmission region in the first direction.

4. The display substrate according to claim 2, wherein in the first pixel region of each of the plurality of pixel repeat units, the first sub-pixel and the second sub-pixel are adjacently arranged in the first direction, the third sub-pixel and the first sub-pixel are adjacently arranged in the second direction, and the second sub-pixel and the third sub-pixel are both arranged adjacent to the first light transmission region in the first direction; and in the second pixel region of each of the pixel repeat units, the first sub-pixel and the second sub-pixel are adjacently arranged in the first direction, the third sub-pixel and the second sub-pixel are adjacently arranged in the second direction, and the first sub-pixel and the third sub-pixel are both arranged adjacent to the first light transmission region in the first direction.

5. The display substrate according to claim 3, wherein in each of the plurality of pixel repeat units, the third sub-pixel in the first pixel region and the first sub-pixel and the second sub-pixel in the second pixel region are arranged in the first direction.

6. The display substrate according to claim 2, wherein the third sub-pixel and the first sub-pixel are adjacently arranged in the second direction; the second sub-pixel is respectively arranged adjacent to the first sub-pixel and the third sub-pixel in the first direction; and the first sub-pixel, the second sub-pixel and the third sub-pixel are all arranged adjacent to the first light transmission region in the first direction.

7. The display substrate according to claim 2, wherein in the first pixel region of each of the plurality of pixel repeat units, the third sub-pixel and the first sub-pixel are adjacently arranged in the second direction, the second sub-pixel is respectively arranged adjacent to the first sub-pixel and the third sub-pixel in the first direction, and the first sub-pixel, the second sub-pixel and the third sub-pixel are all arranged adjacent to the first light transmission region in the first direction; and in the second pixel region of each of the plurality of pixel repeat units, the third sub-pixel and the second sub-pixel are adjacently arranged in the second direction, the first sub-pixel is respectively arranged adjacent to the second sub-pixel and the third sub-pixel in the first direction, and the first sub-pixel, the second sub-pixel and the third sub-pixel are all arranged adjacent to the first light transmission region in the first direction.

8. The display substrate according to claim 1, wherein each of the pixel regions comprises a first sub-pixel, a second sub-pixel, a third sub-pixel and a fourth sub-pixel; and lines connecting centers of the first sub-pixel, the second sub-pixel, the third sub-pixel and the fourth sub-pixel form a parallelogram.

9. The display substrate according to claim 8, wherein in each of the pixel regions, the first sub-pixel and the second sub-pixel are adjacently arranged in the first direction, and the third sub-pixel and the fourth sub-pixel are adjacently arranged in the first direction.

10. The display substrate according to claim 9, wherein one of the first sub-pixel and the second sub-pixel is arranged adjacent to one of the third sub-pixel and the fourth sub-pixel in the second direction; and the other of the first sub-pixel and the second sub-pixel and the other of the third sub-pixel and the fourth sub-pixel are arranged in a staggered mode.

11. The display substrate according to claim 10, wherein in each of the plurality of pixel repeat units, the third sub-pixel and the fourth sub-pixel in the first pixel region and the first sub-pixel and the second sub-pixel in the second pixel region are arranged in the first direction.

12. The display substrate according to claim 8, wherein two of the first sub-pixel, the second sub-pixel, the third sub-pixel and the fourth sub-pixel are sub-pixels with a same light transmission color.

13. A display apparatus, comprising the display substrate according to claim 1.

14. The display substrate according to claim 4, wherein in each of the plurality of pixel repeat units, the third sub-pixel in the first pixel region and the first sub-pixel and the second sub-pixel in the second pixel region are arranged in the first direction.

15. The display substrate according to claim 9, wherein two of the first sub-pixel, the second sub-pixel, the third sub-pixel and the fourth sub-pixel are sub-pixels with a same light transmission color.

16. The display substrate according to claim 10, wherein two of the first sub-pixel, the second sub-pixel, the third sub-pixel and the fourth sub-pixel are sub-pixels with a same light transmission color.

17. The display substrate according to claim 11, wherein two of the first sub-pixel, the second sub-pixel, the third sub-pixel and the fourth sub-pixel are sub-pixels with a same light transmission color.

\* \* \* \* \*